(12) United States Patent
Ahn et al.

(10) Patent No.: US 6,531,968 B2
(45) Date of Patent: Mar. 11, 2003

(54) DIGITAL DATA MODULATING METHOD AND APPARATUS AND MODULATED DATA RECORDING MEDIUM USING THE SAME

(75) Inventors: Seong Keun Ahn, Seoul (KR); Sang Woon Suh, Seoul (KR); Kees A. Schouhamer Immink, Geldrop (NL)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/998,791

(22) Filed: Dec. 3, 2001

(65) Prior Publication Data

US 2002/0135500 A1 Sep. 26, 2002

(30) Foreign Application Priority Data

Mar. 26, 2001 (KR) .............................................. 01-15632
Jul. 11, 2001 (KR) .............................................. 01-41648

(51) Int. Cl.[7] ................................................ H03M 7/00
(52) U.S. Cl. ............................................ 341/59; 341/51
(58) Field of Search .............................. 341/59, 94, 50, 341/61, 58

(56) References Cited

U.S. PATENT DOCUMENTS 6,404,355 B1 * 7/2002 Coene ........................... 341/59
6,417,788 B1 * 7/2002 Mcewen ...................... 341/59

* cited by examiner

*Primary Examiner*—Brian Young
(74) *Attorney, Agent, or Firm*—Birch, Stewart, Kolasch & Birch, LLP

(57) ABSTRACT

A digital data modulating method wherein the last unit of a block consisting of predetermined units is received and a block is obtained which does not infringe A k-constraint in AN RLL code having (d, k) constraints on the basis of a modulation data table of a predetermined unit. A source code word to be modulated to a code word can be quickly and accurately determined while satisfying the (d, k) constraint of the RLL code between the blocks having a predetermined size.

26 Claims, 3 Drawing Sheets

DIGITAL DATA MODULATING METHOD AND APPARATUS AND MODULATED DATA RECORDING MEDIUM USING THE SAME

BACKGROUND OF THE INVENTION

1. Field of the Invention

The present invention relates to modulation of digital data, and more particularly, to a digital data modulating method and apparatus for quickly and accurately determining a code word to be modulated at a boundary between data blocks by using a constraint (d, k) of a run length limited (RLL) code, and a medium for recording a modulated data generated by using the same.

2. Description of the Background Art

In general, in methods for modulating data and recording it in a recording medium, if a signal detected from a recording medium is a binary '0', a non-return-to-zero inverted (NRZI) code indicates that there is no change in a magnetic flux of the recording medium, while if the a signal detected from the recording medium is a binary '1', the NRZI code indicates that the direction of a magnetic flux recorded in the recording medium is transited to the opposite direction, whereby data is recorded onto the recording medium and a recorded signal is detected or reproduced.

The recently used RLL code is an extended code of the NRZI code concept, which converts a 8 bit (1 byte) data to a 16 bit special code (code word). Accordingly, the data recording efficiency is improved as the code word is more densely stored in the recording medium.

For example, since 8 bits entail 256 types of bit combinations, and 16 bits entail 65536 types of bit combinations, the RLL code is generated by converting a 256-bit combination number generated by 8 bits into 256 numbers among the 65536-bit combination number generated by the 16 bits. At this time, the converted data should satisfy the following constraints.

A first constraint is that there should exist a bit having a value of at least one '0' bit among bits having a value of successive '1's.

For example, one data bit is thrice the data recording density stored without any special constraint, and thus, the data is recorded in the recording medium at a high recording density.

In this respect, the first constraint is that even though the data is recorded in the recording medium at a high recording density, it is to be at a distance which enables a magnetic flux polarity of the data bit recorded in the recording medium to be identified.

That is, the first constraint is that the bits having the value of '0' are consecutively recorded in the recording medium, and when the recorded data is reproduced, no interference occurs among the symbols.

A second constraint is to restrict the number of '0's between the '1' bits. The second constraint restores a clock signal from reproduced data by locking a phase locking circuit to the transitions when the data being reproduced are transited.

The RLL code is expressed as (d, k) code, wherein 'd' indicates the minimum number of bits having a value of '0' that is inserted between bits having a value of '1', and 'k' indicates the maximum number of bits having a value of '0' that is inserted between the bits having a value of '1'.

For example, (1, 7) code signifies a code which satisfies a constraint in that bits having a value of at least one '0' should exist among the bits having a recorded value of '1', and bits having a value of a maximum of seven consecutive '1's should exist among the bits having a recorded value of '1'.

At this time, the bits encoded by satisfying the constraints are modulated to bits having a value of '1' for an edge transited from a high level of the data pulse to a low level or from a low level to a high level, and modulated to bits having a value of '0' for the interval with no pulse transition.

Accordingly, the minimum inverse period of the data pulse is expressed by (d+1)T and the maximum inverse period is expressed by (k+1)T. 'T' indicates a bit time interval in a record data stream. For example, in a (d, k)=(1, 7) code, the minimum inverse period (Tmin) becomes 2T and the maximum inverse period (Tmax) becomes 8T.

The recording density of the data recorded in the recording medium is increased. Thus, in the minimum inverse period (Tmin), since the minimum run (2T) is successively generated, the recorded data stream may include a distortion. That is, a focal factor and normal line slope factors of an amplitude of the 2T wave form output are smaller and more easily dispersed than a focal factor and normal line slope factors of amplitudes of other output wave forms. Thus, when the recorded data is reproduced, an error is easily generated.

When a data signal with an error is modulated, when it is recorded, it becomes a data stream including a DC component. Then, for example, when a drive of the recording medium such as a compact disk is survo-controlled, numerous error signals such as tracking errors easily appear in a form of variation or jitter.

Thus, if possible, the modulated signal should be generated without the DC components. For this purpose, a digital sum value (DSV) is controlled for a source code.

The DSV signifies a value of the sum of the data stream generated after source codes are NRZI-modulated.

A method for recording an audio signal in an optical or a magnetic optical recording carrier and reading it uses an eight-to-fourteen modulation (EFM) or an eight-to-fourteen modulation plus (EFM Plus).

The EFM-modulation signal is a code word generated as a series of 8 bit data words which are converted into a series of 14 bit code words, and 3 bits of merging words are additionally inserted thereto.

That is, each 14 bit code word should satisfy the constraint that bits having a value of '0' have a minimum length (the minimum '0' run length, 'd') of '2', and bits having a value of '0' have a maximum length ('0' run length, 'k') of 10 between bits having a value of the two consecutive '1's.

In addition, in order to satisfy the constraints between the code words, 3 bits of merging words are used. For example, for a possible total of eight 3-bit merging words, four 3-bit merging words can be used. That is, it may be 001, 010, 000, 100, and the remaining available 3-bit merging words (111, 011,101,110) may not be used because they are against the regulation of the k (=2) constraint.

As the merging words are determined according to the regulation, low frequency components can be reduced.

However, in the digital modulating method of the conventional art, even through the input code words are converted into code words by controlling the DSV, the code word is not accurately and quickly modulated into words at a boundary between blocks constructed with the plurality of code words (that is, between the last code word of one block and the first code word of the next block).

SUMMARY OF THE INVENTION

Therefore, an object of the present invention is to provide a digital data modulating method that is capable of quickly and accurately determining a code word to be modulated at a boundary between data blocks by using (d, k) constraints of a run length limited (RLL) code, and its apparatus.

Another object of the present invention is to provide a recording medium for storing a digital modulated data by using a digital data modulating method and apparatus that are capable of quickly and accurately determining a code word to be modulated at a boundary between data blocks by using (d, k) constraints of a run length limited (RLL) code.

To achieve these and other advantages and in accordance with the purpose of the present invention, as embodied and broadly described herein, there is provided a digital data modulating method in which the last unit of a block consisting of predetermined units is received and a block is obtained which does not infringe the k-constraint in the RLL code having the (d, k) constraints on the basis of a modulation data table of a predetermined unit.

In the recording medium of the present invention, the last code word of a block consisting of predetermined units is received and units are obtained and stored which do not infringe the k-constraint in the RLL code having the (d, k) constraints on the basis of a modulation data table of a predetermined code word.

To achieve the above objects, there is also provided a digital data modulating method including the steps of: obtaining an ending '0' run length of the last code word of the current block; obtaining a starting '0' run length corresponding to a coding state in which the next block is started; and comparing the total '0' run length generated by adding the ending '0' run length and the starting '0' run length and the pre-set k-constraint, and selecting only a code word satisfying the k-constraint.

To achieve the above objects, there is further provided a digital data modulating method including the steps of: adding a different digital word to an inputted data word and generating a plurality of intermediate sequences; modulating the plurality of intermediate sequences as generated to sequences conforming with the (d, k) constraints according to a pre-set m/n code ratio; and selecting a (d, k) constrained sequence to be recorded in a recording medium, to the exclusion of a (d, k) constrained sequences of '0' run length connected to (d, k) constrained sequences failing to satisfy the k constraint, from the modulated (d, k) constrained sequences.

To achieve the above objects, there is further provided a digital data modulating method including the steps of: adding a different digital word to an inputted data word and generating a plurality of intermediate sequences; modulating the plurality of intermediate sequences as generated to sequences conforming with the (d, k) constraints according to a pre-set m/n code ratio; and selecting a (d, k) constrained sequence to be recorded in a recording medium, to the exclusion of (d, k) constrained sequence having a subsequence of '0' run length exceeding a kset value smaller than 'k' used in the modulation process, from modulated (d, k) constrained sequences.

To achieve the above objects, there is further provided a digital data modulating apparatus including: a generator for adding a different digital word to an inputted data word and generating a plurality of intermediate sequences; and a selector for modulating-the plurality of intermediate sequences as generated to sequences conforming to (d, k) constraints according to a pre-set m/n coding ratio, and selecting a (d, k) constrained sequence from modulated (d, k) constrained sequences.

To achieve the above objects, there is further provided a digital data modulating method comprising: a first step in which a different digital word is added to an inputted data word to generate a plurality of intermediate sequences; a second step in which the plurality of intermediate sequences as generated are modulated to sequences conforming with (d, k) constraints according to a pre-set m/n code ratio; and a third step in which a (d, k) constrained sequence is selected to be recorded in a recording medium, to the exclusion of sequences of which '0' run length connected to (d, k) constrained sequences fail to satisfy the k constraint, from modulated (d, k) constrained sequences.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The present invention is directed to a digital data modulating method and apparatus for quickly and accurately determining a code word to be modulated at a boundary between data blocks by using a constraint (d, k) of a run length limited (RLL) code, and a medium for recording a modulated data generated by using the same.

Figure 1:
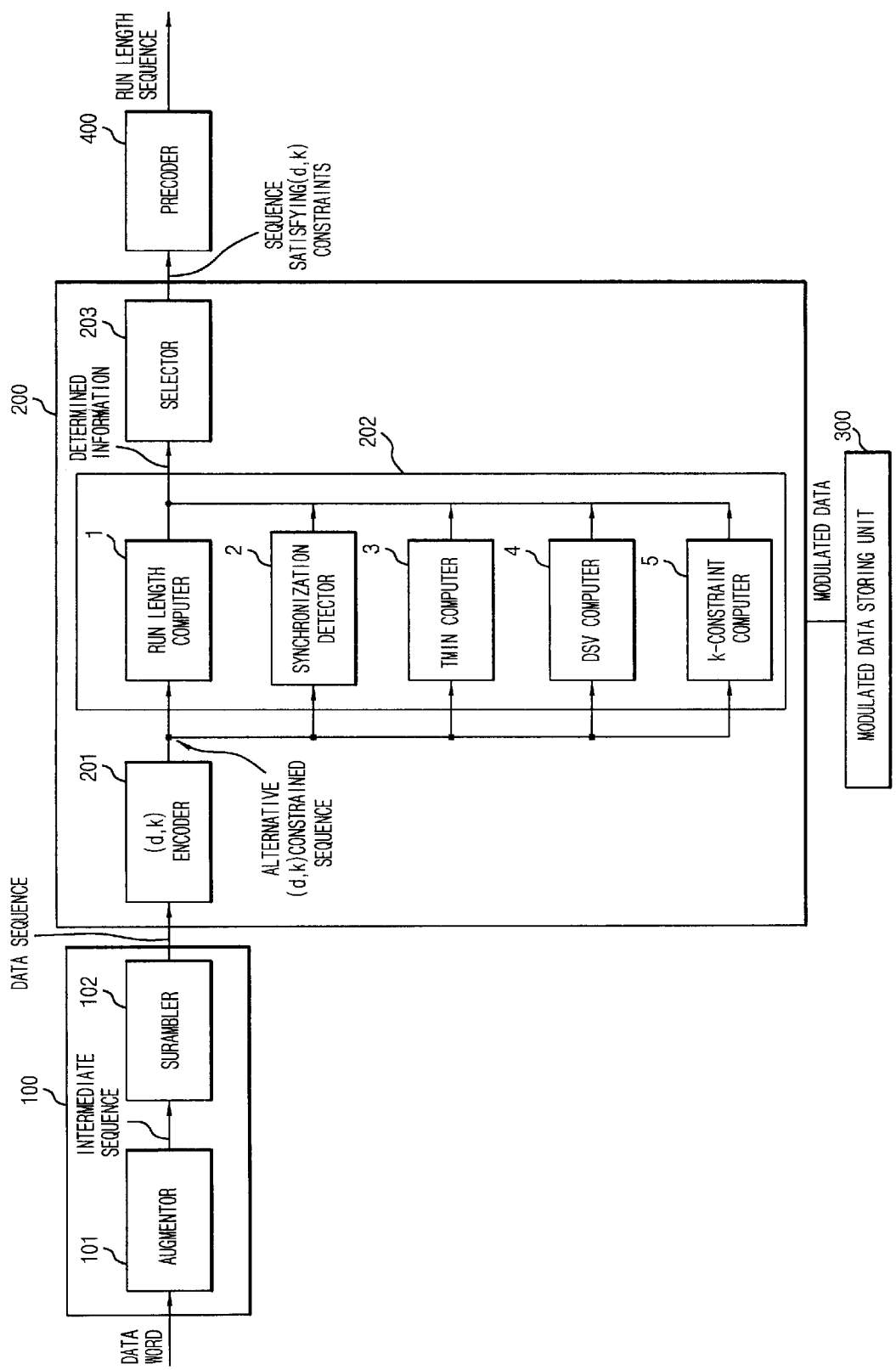
FIG. 1 is a schematic block diagram of a digital data modulating apparatus in accordance with a preferred embodiment of the present invention.

FIG. 1 is a schematic block diagram of a digital data modulating apparatus in accordance with a preferred embodiment of the present invention.

As shown in FIG. 1, a digital data modulating apparatus of the present invention includes a sequence generating unit 100 for receiving a data word and generating a data sequence, a selecting unit 200 for receiving the data sequence and selecting a sequence which satisfies a (d, k) constraint; a storing unit 300 for storing a modulation data to be used as a reference when the selector 200 selects the sequence which satisfies the (d, k) constraint; and a pre-coding unit 400 for receiving the sequence which satisfies the (d, k) constraint and generating a run length sequence with a restrained low frequency component.

The sequence generator 100 includes an augment unit 101 for receiving the data words, combining them and generating a plurality of intermediate sequences and a scrambler 102 for scrambling the intermediate sequences, generating a data sequence and outputting it.

The selecting unit 200 includes a (d, k) encoder 201 for receiving the data sequence from the sequence generating unit 100 and generating an alternative (d, k) constrained sequence, a determining unit 202 for receiving the alternative (d, k) constrained sequence and determining whether the alternative (d, k) constrained sequence contains an undesired sub-sequence such as a synchronous pattern, a string with a long '0's or a string with a long run of the alternate Tmin; and a selector 203 for selecting a sequence which satisfies the (d, k) constraint on the basis of the information determined by the judging unit 202 and outputting it.

The determining unit 202 includes a run length computer 1 for receiving the alternative (d, k) constrained sequence and computing the successive number of '0' (that is, '0' run length); a synchronization detector 2 for receiving the alternative (d, k) constrained sequence and detecting whether there is a predetermined synchronization pattern; a computer 3 for receiving the alternative (d, k) constrained sequence and computing the number of run lengths of the successive Tmin; a DSV computer for receiving the alternative (d, k) constrained sequence and computing a DSV; and a k-constraint computer 5 for receiving the alternative (d, k) constrained sequence and computing a k-constraint between the successive two sequences.

Figure 2:
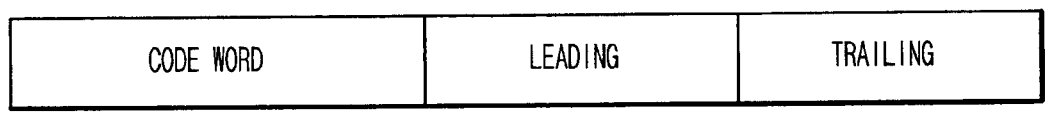
FIG. 2 shows the structure of one unit contained in one data block in accordance with the preferred embodiment of the present invention.
Figure 3A:
FIGS. 3A and 3B show the structure of data blocks in accordance with the preferred embodiment of the present invention.
Figure 3B:
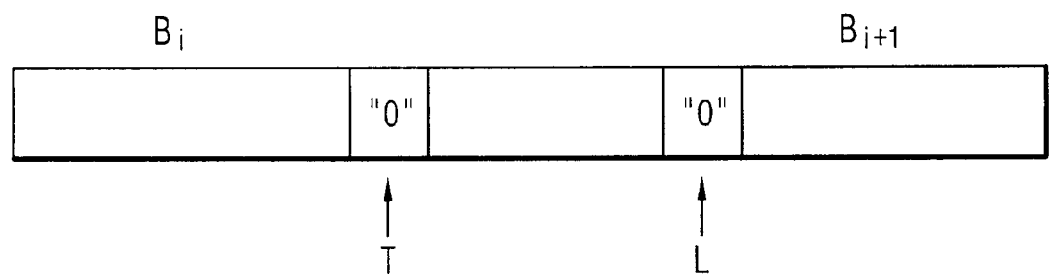
Figure 4:
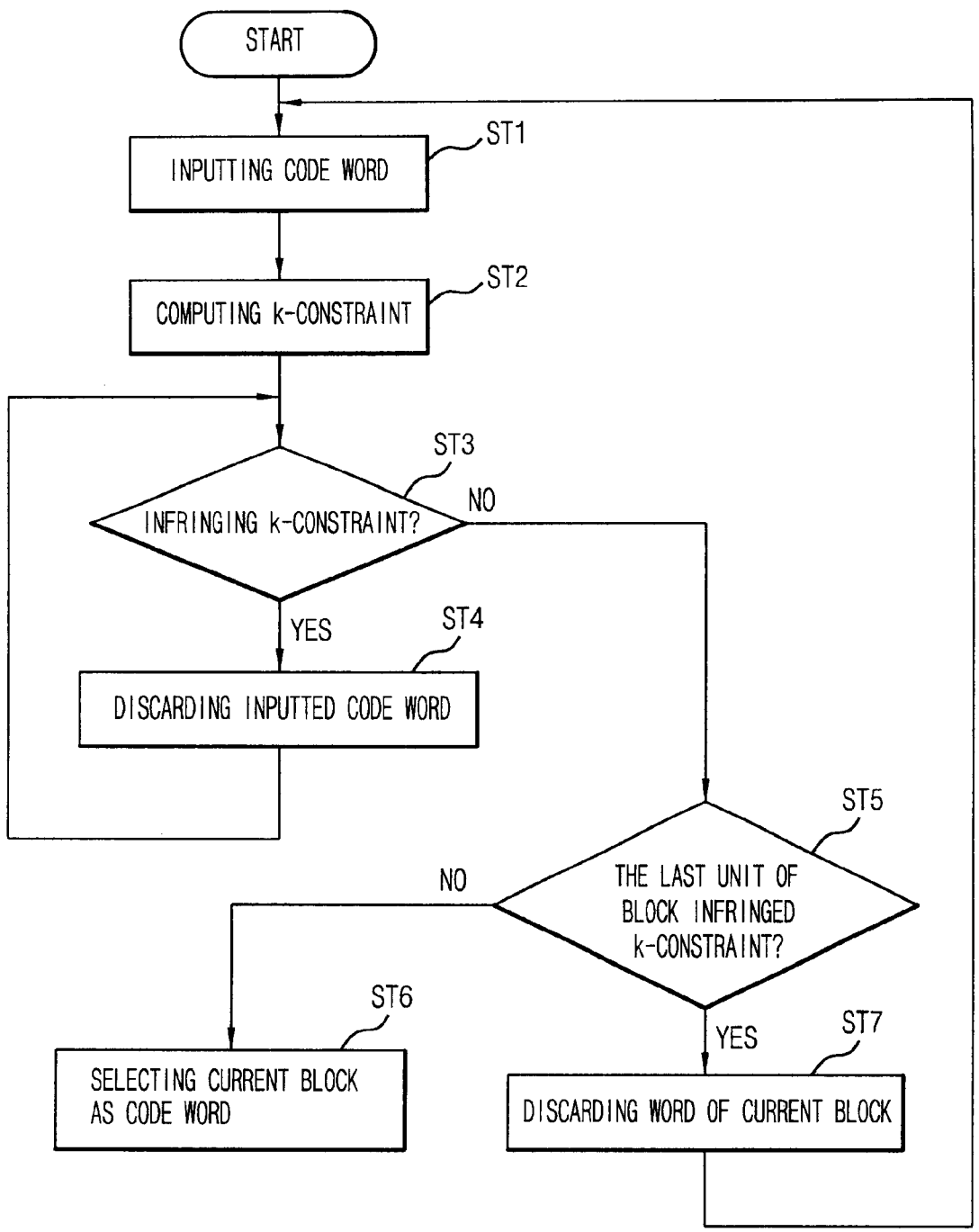
FIG. 4 is a flow chart of a digital data modulating method in accordance with the preferred embodiment of the present invention.

FIG. 2 shows the structure of one unit contained in one data block in accordance with the preferred embodiment of the present invention, FIGS. 3A and 3B show the structure of data blocks in accordance with the preferred embodiment of the present invention, and FIG. 4 is a flow chart of a digital data modulating method in accordance with the preferred embodiment of the present invention.

As shown in FIG. 2, a data unit of the present invention includes a code word, a leading portion indicative of the number of '0's in front of the code word and a trailing portion indicate of the number of '0's to the rear of the code word.

As shown in FIG. 3, a block formed as the units are collected constitutes a predetermined block data (B1, B2, . . . , Bi, Bi+1) together with other blocks.

When the blocks are desired to be connected, as shown in FIG. 3B, the trailing portion (T) of the last unit of the current block (Bi) and the reading portion (L) of the first unit of the block (Bi+1) to be combined to the trailing portion (T) should satisfy the pre-set k-constraints.

A process for forming the block data by connecting the blocks will now be described in detail with reference to FIG. 4.

In order to determine whether the k-constraint is conformed among the alternative (d, k) constrained sequences, the k-constraint computer 5 compares the '0' run length between the alternative (d, k) constrained sequence which has been previously inputted) and the currently inputted alternative (d, k) constrained sequence.

That is, the k-constraint computer 5 compares the k (=T+L) value obtained by adding the '0' run length of the trailing portion (T) of the alternative (d, k) constrained sequence which has been previously inputted and that of the leading portion (L) of the currently inputted alternative (d, k) constrained sequence and the pre-set kset value. If T+L is greater than kset, the k-constraint computer 5 discards the current sequence (steps ST1~ST4 or ST5 and ST7) and receives a new sequence to repeat the above process.

If the (d, k) constraint is satisfied, the k-constraint computer 5 selects the current sequence (ST6). As shown in FIG. 2, the sequence may be a unit contained in one block, and after the process if performed for the units, the block is determined.

The k-constraint computer 5 may set newly the k-constraint of the value ($k_{SET}$) smaller than the 'k' value as a constraint used in modulating from 'm' bit to 'n' bit, on the basis of a table of the (d, k) encoder 201.

If the k-constraint computer 5 newly sets the k-constraint, it checks whether there is a successive '0' run beyond the set kSET for the overall sequence, not only the sequence connected portion. If there is a successive '0' run, the k-constraint computer 5 sets a flag for the sequence and outputs the sequence to the selector 203.

For modulation, even if the k-constraint computer 5 sets a value smaller than the 'k' constraint, since, for example, $2^r$ number of alternative (d, k) constrained sequences are generated, if the value 'r' is greater, there must be a sequence satisfying the $k_{SET}$ constraint among the values. Then, edge information of the recorded signal can be more frequently recorded on average.

If the table used in the (d, k) encoder is made, for example, under the k=14 constraint, the k-constraint computer 5 may select one of the values from 9, 10, 11, 12 and 13 as a $k_{SET}$ constraint.

If the $k_{SET}$ is too small, there may not be a sequence which satisfies the $k_{SET}$ in the alternative (d, k) constrained sequence. Thus, a value that is too small is excluded.

If the constraint of the table of the (d, k) encoder 201 is, for example, k=18, one of the values from 9 to 17 may be selected and used as the $k_{SET}$.

Accordingly, the thusly measured or computed several values and the flag indicated by the synchronization detection are outputted from the judging unit 202 to the selector 203.

Then, the selector 203 determines one sequence to be finally selected and recorded on the basis of the DSV related to the inputted several measured values.

At this time, the selector 203 excludes the sequence having the set flag from the selection and selects one of the remaining alternative (d, k) constrained sequences.

The selected (d, k) constrained sequence is converted into a modulation signal through an NRZI pre-coding process by the pre-coder 400, and the modulation signal is generated from the selected (d, k) constrained sequence which has been 2-integrated to a module transited in '1' and without transition in '0', and recorded in the recording medium.

In the above-described modulating method of the present invention, in case that the (d, k) encoder 201 has a code modulation factor of an s/c (s: a source code, c: a code), an inputted sequence is modulated to a code word without infringing the k-constraint defined in the (d, k) code of the RLL code.

The (d, k) encoder 201 refers to the modulation data storing unit so as to modulate it to the code word without infringing the 'k' constraint among the neighboring code words.

That is, in order for a code word not to infringe the 'k' constraint at the boundary where the two blocks are connected, the (d, k) encoder counts the number (vector (v)) starting from '0' of the code word in each state and sets it as the maximum value.

A method for obtaining the vector by referring to the contents disclosed in the previous application (PCT/KR00/01292) of the inventor of this invention will now be described.

As disclosed in the embodiment of the corresponding application, in a code table of 9/13 modulation factor, 13 coding states and a d-constraint of '1', a vector (v) is {9, 5, 3, 3, 2, 2, 1, 1, 0, 0, 0, 0, 0}.

That is, the vector signifies the run length of the longest starting '0' among the code words of a corresponding coding state for each of the 13 coding states.

As a first value, 'v(1)=9' signifies that the maximum number (that is, a starting '0' run length) that bits having a successive value of '0' among the code words in the coding state '1' is 9. Likewise, 'v(2)=5' indicates that the starting '0' run length value among the code words in the coding state '2' is 5.

Accordingly, by using the modulation data table in the above described method, a vector (the number of bits having the starting '0' run length value coming in the next state) can be obtained.

Meanwhile, the vector (v) may be defined differently for every modulation data table according to the state.

In addition, a method in which a code word is modulated to another code word in one block, and a method in which another code word is modulated to a code word between blocks will now be described.

In order to modulate another code word to a code word without an error between blocks, the code words are modulated to a code word, and the modulation process is performed for one block, and then at a time point when the block is ended, a '0' run length value (T) is obtained. At the time point, the next state (U) can be recognized, so that a vector (v(U)) of the next state is also computed.

When the ending '0' run length value (T) in the last code word which finishes one block and the starting '0' run length (L) of the next coding state are added, it becomes a predicted '0' run length value (k+T+L) of a code word to be modulated in the next block.

The predicted '0' run length value (k) is compared to the pre-set kset value. If the predicted '0' run length value (k) is greater than the pre-set kset value, an inputted code word is excluded from the candidates of the code words to be modulated.

Accordingly, the digital data modulating method and apparatus of the present invention can accurately modulate inputted data without an error between blocks.

In addition, the digital modulation data generated by using the digital data modulating method and apparatus of the present invention can be stored in a recording medium, and corresponding code words can be directly converted to a code word according to a code word pattern discovered between blocks by using the recording medium.

As described, according to the digital data modulating method and apparatus and modulated data recording medium using the same of the present invention, the source code word to be modulated to a code word can be quickly and accurately determined while satisfying the (d, k) constraint of the RLL code between blocks having a predetermined size.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A digital data modulating method wherein a last unit of a block consisting of predetermined units is received, and a block is obtained which does not infringe a k-constraint in an RLL code having (d, k) constraints on the basis of a modulation data table of a predetermined unit.

2. The method of claim 1, wherein in obtaining the blocks which does not infringe the k-constraint, a run length of the last unit of the block and a run length of a unit to be modulated in a next block are added to compute a k-constraint of the last unit of the block.

3. The method of claim 1, wherein the blocks include a plurality of units.

4. The method of claim 1, wherein the unit comprises:
   a code word;
   a leading portion indicative of the number of '0's in front of the code word; and
   a trailing portion indicative of the number of '0's to the rear of the code word.

5. The method of one of claims 1 to 4, wherein the data modulated by the digital data modulating method is stored.

6. A recording medium that receives a last code word of a block consisting of predetermined units obtains and stores units which do not infringe a k-constraint in an RLL code having (d, k) constraints on the basis of a modulation data table of a predetermined code word.

7. The recording medium of claim 6, wherein the obtained units are modulated data.

8. The recording medium of claim 6, wherein the units which do not infringe the k-constraint are obtained by adding a run length of a last unit of the block and a run length of a unit to be modulated in a next block and computing a k-constraint of the last unit of the block.

9. The recording medium of claim 6, wherein the blocks include a plurality of units.

10. The recording medium of claim 6, wherein the unit comprises:
    a code word;
    a leading portion indicative of the number of '0's in front of the code word; and
    a trailing portion indicative of the number of '0's to the rear of the code word.

11. A digital data modulating method comprising the steps of:
    obtaining an ending '0' run length of a last code word starting in a current block;
    obtaining a starting '0' run length corresponding to a coding state in which a next block is started; and
    comparing a total '0' run length generated by adding the ending '0' run length and the starting '0' run length and a pre-set k-constraint, and selecting only a code word satisfying the k-constraint.

12. The method of claim 11, wherein, in the step of obtaining an ending '0' run length of the last code word starting in the current block, a starting '0' run length of the unit in which the starting '0' run length is a maximum among entire units contained in a corresponding coding state is determined by a corresponding value.

13. The recording medium of claim 11, wherein the data modulated by the digital data modulating method is stored.

14. A digital data modulating method comprising the steps of:
   adding a different digital word to an inputted data word and generating a plurality of intermediate sequences;
   modulating the plurality of intermediate sequences as generated to sequences conforming with (d, k) constraints according to a pre-set m/n code ratio; and
   selecting a (d, k) constrained sequence to be recorded in a recording medium, to the exclusion of (d, k) constrained sequences of which a '0' run length connected to (d, k) constrained sequences fail to satisfy the k constraint, from a modulated (d, k) constrained sequences.

15. The method of claim 14, wherein the modulating step comprises: scrambling the plurality of intermediate sequences as generated.

16. The method of claim 14, wherein, in the modulating step, a digital word of r-bit size is added to each input data word, and as many as possible digital words are generated in the r-bit size and added to the input data word, thereby generating intermediate sequences of up to 'r' bits.

17. A digital data modulating method comprising the steps of:
   adding a different digital word to an inputted data word and generating a plurality of intermediate sequences;
   modulating the plurality of intermediate sequences as generated to sequences conforming with (d, k) constraints according to a pre-set m/n code ratio; and
   selecting a (d, k) constrained sequence to be recorded in a recording medium, to the exclusion of a (d, k) constrained sequence having a sub-sequence of '0' run length exceeding a kset value smaller than 'k' used in the modulation process, from a modulated (d, k) constrained sequences.

18. The method of claim 17, wherein the step of generating a plurality of intermediate sequences comprises a step of scrambling the plurality of intermediate sequences.

19. The method of claim 18, wherein, in the generating step, a digital word of r-bit size is added to each input data word, and as many as possible digital words are generated in the r-bit size as every possible and added to the input data word, thereby generating intermediate sequences of up to 'r' bits.

20. A digital data modulating apparatus comprising:
   a generator for adding a different digital word to an inputted data word and generating a plurality of intermediate sequences; and
   a selector for modulating the plurality of intermediate sequences as generated to (d, k) constrained sequences according to a pre-set m/n coding ratio, and selecting one (d, k) constrained sequence from a modulated alternative (d, k) constrained sequences.

21. The apparatus of claim 20, wherein the generator comprises:
   an augmentor for adding a different digital word to each input data word and generating a plurality of intermediate sequences; and
   a scrambler for scrambling each intermediate sequence as generated.

22. The apparatus of claim 21, wherein the augmentor adds a digital word of r-bit size to each input data word, and generates as many as possible digital words in the r-bit size and adds them to the input data word, thereby generating intermediate sequences of up to 'r' bits.

23. The apparatus of claim 21, wherein the selecting unit comprises:
   an encoder for modulating each intermediate sequence to a sequence in conformity to (d, k) constraints in a coding ratio m/n;
   a judging unit for giving each of the modulated sequences a demerit mark according to the content of the bits and the occurrence frequency of a predetermined sub-sequence; and
   a selector for selecting a (d, k) constrained sequence with a smallest demerit mark as given by the judging unit among the modulated sequences, as a sequence for being recorded in a recording medium.

24. A digital data modulating method comprising:
   a first step in which a different digital word is added to an inputted data word to generate a plurality of intermediate sequences;
   a second step in which the plurality of intermediate sequences as generated are modulated to sequences conforming with (d, k) constraints according to a pre-set m/n code ratio; and
   a third step in which a (d, k) constrained sequence is selected to be recorded in a recording medium, to the exclusion of sequences in which a '0' run length connected to (d, k) constrained sequences fail to satisfy the k constraint, from the modulated alternative (d, k) constrained sequences.

25. The method of claim 24, wherein the first step comprises a step of scrambling the plurality of intermediate sequences as generated.

26. The method of claim 24, wherein, in the first step, a digital word of r-bit size is added to each input data word, and as many as possible digital words are generated in the r-bit size and added to the input data word, thereby generating intermediate sequences of up to 'r' bits.

* * * * *